(12) United States Patent
Bhakta et al.

(10) Patent No.: US 8,481,626 B1
(45) Date of Patent: Jul. 9, 2013

(54) WAX-BASED ENCAPSULANT/MOISTURE BARRIER FOR USE WITH ELECTRONICS RECEIVED IN WATER METER PITS

(75) Inventors: Satish D. Bhakta, Minnetonka, MN (US); Tom Chastek, Spokane, WA (US)

(73) Assignee: Itron, Inc., Liberty Lake, WA (US)

( * ) Notice: Subject to any disclaimer, the term of this patent is extended or adjusted under 35 U.S.C. 154(b) by 0 days.

(21) Appl. No.: 13/350,975

(22) Filed: Jan. 16, 2012

(51) Int. Cl.
  *C09D 11/02* (2006.01)
  *H01L 21/00* (2006.01)
(52) U.S. Cl.
  USPC .......................................... 524/270; 438/126
(58) Field of Classification Search
  USPC ....................................................... 524/270
  See application file for complete search history.

(56) References Cited

U.S. PATENT DOCUMENTS

| | | | |
|---|---|---|---|
| 4,911,992 A | 3/1990 | Haluska et al. | |
| 4,977,009 A | 12/1990 | Anderson et al. | |
| 5,863,857 A | 1/1999 | Lamb et al. | |
| 6,218,995 B1 | 4/2001 | Higgins et al. | |
| 6,284,818 B1 | 9/2001 | Kawata et al. | |
| 6,297,324 B1 | 10/2001 | Briddell et al. | |
| 6,936,646 B2 | 8/2005 | Ahsan et al. | |
| 7,338,993 B2 | 3/2008 | Ahsan et al. | |
| 7,479,653 B2 | 1/2009 | Gillissen et al. | |
| 7,510,422 B2 | 3/2009 | Showcatally et al. | |
| 7,723,412 B2 * | 5/2010 | Wermter et al. | 524/151 |
| 7,732,543 B2 | 6/2010 | Loch et al. | |
| 7,741,388 B2 | 6/2010 | Murotani et al. | |
| 7,763,673 B2 | 7/2010 | Okamoto et al. | |
| 7,893,170 B2 | 2/2011 | Wakioka et al. | |
| 7,920,163 B1 | 4/2011 | Kossin | |
| 7,932,301 B2 | 4/2011 | Liu et al. | |
| 7,994,935 B2 | 8/2011 | Salser, Jr. et al. | |
| 7,999,016 B2 | 8/2011 | Osada et al. | |
| 8,003,736 B2 | 8/2011 | Sueyoshi et al. | |
| 8,089,062 B2 | 1/2012 | Wu et al. | |
| 8,264,415 B2 | 9/2012 | Winkler et al. | |
| 2009/0149604 A1 * | 6/2009 | Abhari et al. | 525/209 |
| 2010/0067168 A1 | 3/2010 | Summers et al. | |
| 2010/0311207 A1 | 12/2010 | Musa | |
| 2011/0073901 A1 | 3/2011 | Fujita et al. | |
| 2011/0260947 A1 | 10/2011 | Cornwall et al. | |

FOREIGN PATENT DOCUMENTS

| | | | |
|---|---|---|---|
| CA | 2 766 248 A1 | | 4/2012 |
| CN | 1458216 | * | 11/2003 |

OTHER PUBLICATIONS

Notice of Allowance issued Nov. 27, 2012 in Canadian Patent Application No. 2,766,645.
Machine translation of CN1458216 listed above.
Machine translation of Abstract of CN1458216 listed above.
Canadian Patent Application No. 2,766,645 Office Action dated Apr. 23, 2012.
Paper—"Resins for Potting and Encapsulation in the Electronics & Electrical Industries" from Electrolube, 4 pages.
Paper—"Tackifiers for Adhesives" from Arizona Chemical, Feb. 2010, 8 pages.
Paper—"Types and Performance Characteristics of Thixotropic Agents" from Kusumoto Chemicals, Ltd., Apr. 13, 1999, 3 pages.
Canadian Patent Application No. 2,766,645 Office Action dated Aug. 7, 2012.
International Search Report and Written Opinion for PCT/US201310217627, Mar. 19, 2013, 7 pages.
International Search Report and Written Opinion for PCT/US2013/021629, Mar. 22, 2013, 8 pages.

* cited by examiner

*Primary Examiner* — Hui Chin
(74) *Attorney, Agent, or Firm* — Dority & Manning, P.A.

(57) ABSTRACT

The presently disclosed subject matter is directed to an encapsulant for electronic components such as those utilized in AMR technology. The encapsulant comprises a wax, a tackifier, a polymer, a plasticizer, a thixotropic agent, and an antioxidant and is designed to protect electronic components from harsh environments such as those where high levels of humidity or corrosive liquids may be present. For example, the encapsulant exhibits minimal percent weight gain due to moisture vapor when subjected to temperatures ranging from about −40° C. to about 70° C. and relative humidities ranging from 0% to 85% over a period of 200 days.

16 Claims, 4 Drawing Sheets

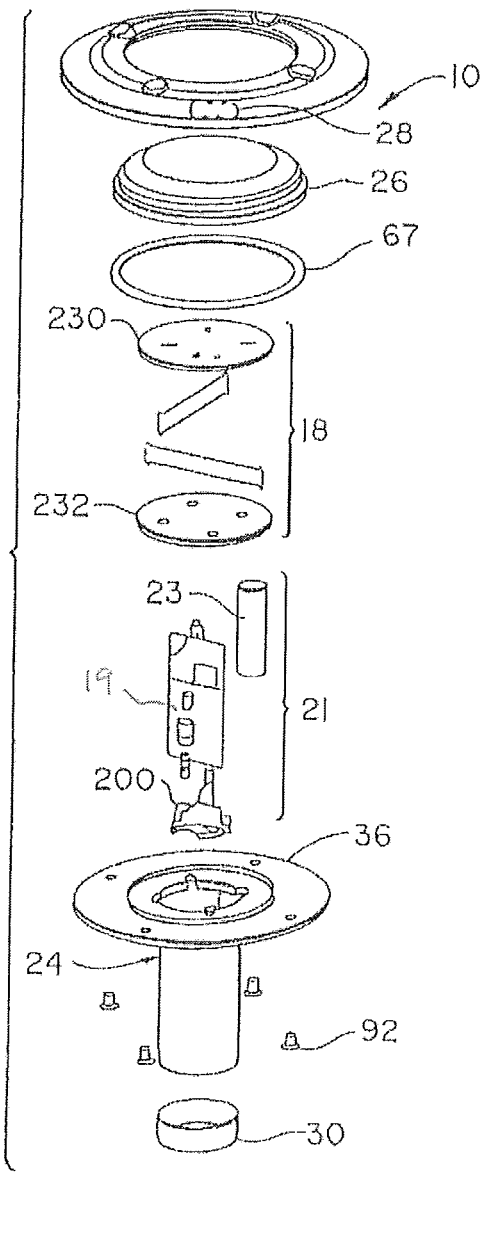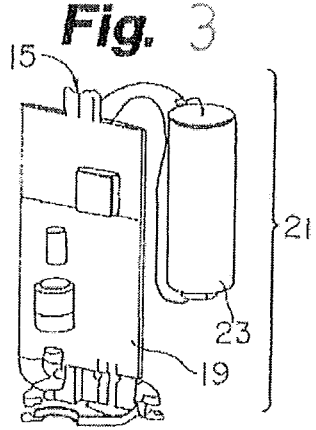

WAX-BASED ENCAPSULANT/MOISTURE BARRIER FOR USE WITH ELECTRONICS RECEIVED IN WATER METER PITS

FIELD OF THE SUBJECT MATTER

The presently disclosed subject matter relates to Automatic Meter Reading (AMR) technology. More particularly, the presently disclosed subject matter relates to an encapsulant that can be used to insulate electronic components associated with AMR technology to protect the components from harsh environments.

BACKGROUND OF THE SUBJECT MATTER

AMR technology used in conjunction with utility meters, and particularly water meters, must generally operate in relatively harsh environments. For example, water meters and AMR components placed in water meter pits are exposed to high humidity levels almost constantly. Additionally, meters and associated components placed into pits are potentially subject to corrosion due to contact with various corrosive liquids. Often designers try to design the meter components from materials that are capable of withstanding exposure to moisture and/or corrosive liquids. Another option is to hermetically seal the housings containing any electronic components, though this is often not a desired approach because of manufacturing constraints and high costs. Still another approach is to try to insulate any electronic components associated with utility meters from harsh environments through the use of various encapsulants or potting materials.

In cases where electrical components are located in harsh environments, a potting material or encapsulant with a decreased diffusion rate that corresponds with improved moisture protection and shields the components from corrosive liquids is thus desired. While silicones, polyurethanes, and epoxies have been developed as potting materials and can provide some protection against moisture, thermal shock, and vibration, such potting materials/encapsulants still allow for the penetration of moisture over time due to their higher permeability and diffusion rates. Thus, these materials do not sufficiently waterproof the electrical components that they surround.

Prior publications that describe potting materials or encapsulants include U.S. Pat. No. 7,999,016 to Osada et al. disclosing a "Semiconductor Encapsulating Epoxy Resin and Semiconductor Device," U.S. Pat. No. 7,763,673 to Okamoto et al. disclosing a "Curable Composition Containing a Silicon-Containing Group Polymer, a Titanium Chelate, and an Amide Wax," U.S. Pat. No. 7,741,388 to Murotani et al. disclosing an "Epoxy Resin Composition and Semiconductor Device," U.S. Pat. No. 4,977,009 to Anderson et al. disclosing "Composite Polymer/Dessicant Coatings for IC Encapsulation," and U.S. Patent Application Publication No. 2010/0067168 by Summers et al. disclosing "Composite Organic Encapsulants." The complete disclosures of such patent publications are fully incorporated by reference herein for all purposes.

While various compositions have been developed for potting or encapsulating electronic components, and while some level of protection from harsh environments has been provided, no particular composition has emerged that encompasses all of the desired characteristics as hereafter presented in accordance with the subject technology.

SUMMARY OF THE SUBJECT MATTER

In view of the recognized features encountered in the prior art and addressed by the presently disclosed subject matter, an improved wax-based encapsulant for use with electronics received in water meter pits has been provided.

The present disclosure contemplates an encapsulant for use with electronic components used in automatic meter reading technology operating at temperatures of less than about 65° C. The encapsulant can include a wax, a tackifier, a polymer, and a plasticizer. The encapsulant can exhibit a percent weight gain of only from about 0.001% by weight to about 1.5% by weight over a period of about 200 days when the temperature ranges from about −40° C. to about 70° C. and when the relative humidity ranges from about 0% to about 85%.

Additional objects and advantages of the presently disclosed subject matter are set forth in, or will be apparent to, those of ordinary skill in the art from the detailed description herein. Also, it should be further appreciated that modifications and variations to the specifically illustrated, referred and discussed features, elements, and steps hereof may be practiced in various embodiments and uses of the presently disclosed subject matter without departing from the spirit and scope of the presently disclosed subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the presently disclosed subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the presently disclosed subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the presently disclosed subject matter, including the best mode thereof, directed to one of ordinary skill in the art, is set forth in the specification, which makes reference to the appended figures, in which:

FIG. 2 illustrates an exploded view of an assembly including electronic circuitry that may be present in AMR technology in utility meter pits;

FIG. 3 illustrates a perspective view of an electronic subassembly that may be present in AMR technology in utility meter pits;

Figure 1:
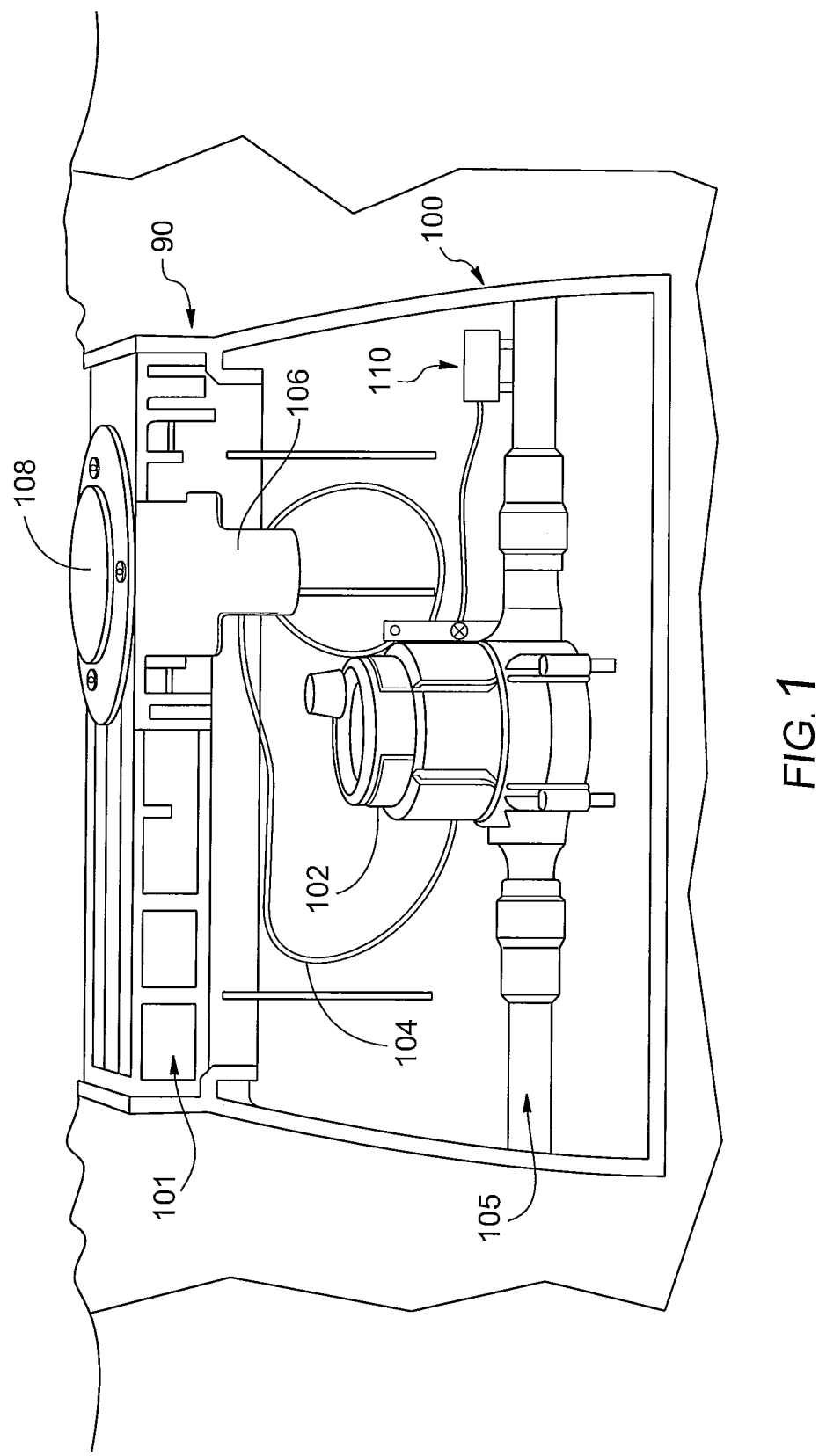
FIG. 1 illustrates a utility meter pit configuration.

Repeat use of reference characters throughout the present specification and appended drawings is intended to represent same or analogous features, elements, or steps of the presently disclosed subject matter.

DETAILED DESCRIPTION OF THE PREFERRED EMBODIMENTS

As discussed in the Summary of the Subject Matter section above, the presently disclosed subject matter is particularly concerned with an encapsulant that can be used in, for example, AMR technology, or any application where a barrier to moisture or corrosive liquids is desired. Thus, although the encapsulant is generally described in the context of utility meter pits, its use is not to be construed as limited to such technology.

Selected combinations of aspects of the disclosed technology correspond to a plurality of different embodiments of the presently disclosed subject matter. It should be noted that each of the exemplary embodiments presented and discussed herein should not insinuate limitations of the presently disclosed subject matter. Features or steps illustrated or described as part of one embodiment may be used in combination with aspects of another embodiment to yield yet further embodiments. Additionally, certain features may be interchanged with similar devices, compositions, or features not expressly mentioned which perform the same or similar function.

Reference will now be made in detail to examples demonstrating the use of the wax-based encapsulant of the present disclosure, followed by a description of the encapsulant, which exhibits improved moisture barrier properties. The presently disclosed subject matter in certain embodiments thereof corresponds to a wax-based encapsulant that protects any electrical components used in AMR technology, although the encapsulant may also be used in other applications where electrical components may need to be protected from a harsh environment, such as where moisture or corrosive liquids may be present.

Referring now to the drawings, FIG. 1 illustrates a utility meter pit 100 that may contain electronic components coated with the encapsulant of the present disclosure. A utility-meter pit assembly 90 allows access to below-ground meters, such as a water meter 102 as shown, that are used to measure consumption of water, gas, electricity, and the like. The pit 100 is closed with a lid 101 to protect the equipment inside. Components of a utility meter reading system, such as a cable 104, a radio-frequency (RF) transmitter 108, a leak sensor 110, and the like can be located in the utility-meter pit 100 and associated with, for example, a water pipe 105. An AMR device 106 may include an encoder and an integral RF antenna (not shown). Alternatively, these components can be installed in separate housings and joined with a cable or other connector. The AMR device 106, leak sensor 110, and other components contain electrical circuitry, which can be damaged if contacted by corrosive liquids or moisture. While at least the AMR device 106 can be attached to the pit lid 101 so that it is positioned relatively far from the bottom of the pit 100 to help keep the AMR device 106 away from water and other contaminants that are likely to be present deeper in the pit, the AMR device may still be exposed to extremely humid conditions and/or corrosive liquids. Additionally, other components such as the leak sensor 110 will inevitably be exposed to moisture and possibly corrosive liquids. Thus, the wax-based encapsulant of the present disclosure can be utilized to protect such components from the intrusion of such moisture and/or corrosive liquids.

With reference to present FIG. 2, there is illustrated an exploded view of an assembly that includes a detailed view of the electrical components that may be coated with the encapsulant material in accordance with the present description. FIG. 2 depicts a telemetry antenna system 10 with bulkhead 200. A radome 26 is placed in an inverted position into retainer ring 28, and a seal is formed with o-ring 67. While the radome 26 can weatherproof the telemetry antenna system 10 associated with a utility meter pit and AMR technology to some extent, there is still moisture within the pit, and it is still possible that moisture and corrosive liquids can come into contact with components that encompass the telemetry antenna system 10. Thus, the need for an improved encapsulant is required as described herein. The radiator sub-assembly 18, telemetry board 19, and battery 23 are housed within the telemetry antenna system in between the radome 26 and end cap 30 to protect them from moisture, although there is still the potential for the seepage of moisture or corrosive liquids into the telemetry antenna system 10. As shown, the telemetry board 18 and battery 23 rest in base 24. Screws 92 are secured to annular plate 36 and retaining ring 28 to complete assembly of base 24 to radome 26 and retainer ring 28.

In operation, the radiator sub-assembly 18 receives a signal from a host. This signal is a wake-up call to the telemetry board 19. The telemetry board 19 responds by transmitting, by radio frequency, an identification signal and meter data from an attached meter, such as water meter 102 shown in FIG. 1. The transmission from telemetry board 19, which is powered by battery 23, is radiated out from radiator sub-assembly 18 for reception by the host.

With reference to FIG. 3, there is illustrated a perspective view of an electronic sub-assembly 21 that is also shown as a component of FIG. 2. As is represented by present FIG. 3, the sub-assembly may include a battery 23, a telemetry board 19, and an antenna feed connection 15. The electronic sub-assembly is by nature placed in a harsh environment when it is located in a water meter pit such as pit 100 shown in FIG. 1. Hence, a need exists for the wax-based moisture barrier encapsulant of the present disclosure that has low diffusion rates and low water permeability, which can protect the electronic sub-assembly from damage.

Figure 4:
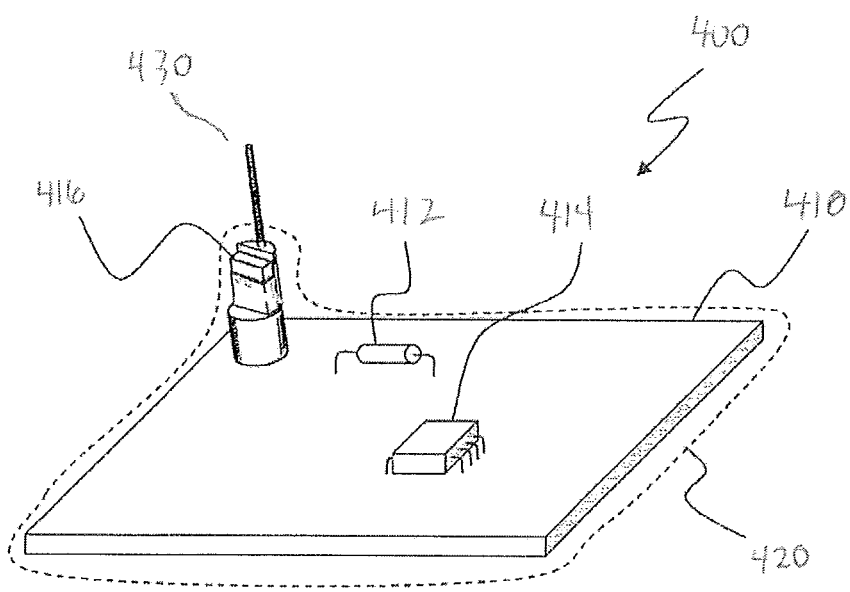
FIG. 4 illustrates a meter endpoint circuit board coated with the encapsulant of the present disclosure.

With reference to present FIG. 4, there is illustrated another type of electrical component that may be included in AMR technology. An endpoint circuit board 400 generally incorporating the present encapsulant material 420 is shown. Referring to FIG. 4, an endpoint circuit board 400 includes a supporting substrate corresponding to a printed circuit board (PCB) 410 configured to support and interconnect endpoint components including circuitry components 412 and 414 and at least a portion of a two-part antenna coupler 416. The endpoint circuit board 400 is shown coated in the encapsulant 420 of the present description.

As illustrated in present FIG. 4, the male portion of the two-part antenna coupler 416 has been mounted to PCB 410, an antenna 430 has been affixed to the female portion of two-part antenna coupler 416, and both the male and female portions as well as an end portion of antenna 430 have been coated with encapsulant 420 along with the other components 412 and 414 that are mounted to PCB 410. Those of ordinary skill in the present art will appreciate that exemplary endpoint 400 may be incorporated into a meter module. In certain instances, such meter modules may be installed in a pit and may be located as deep as 3 to 4 feet below local surface level. As many pits for water meters fill with water, there is thus a need for an improved encapsulant to protect such components as endpoint 400 from moisture and corrosion.

Figure 5:
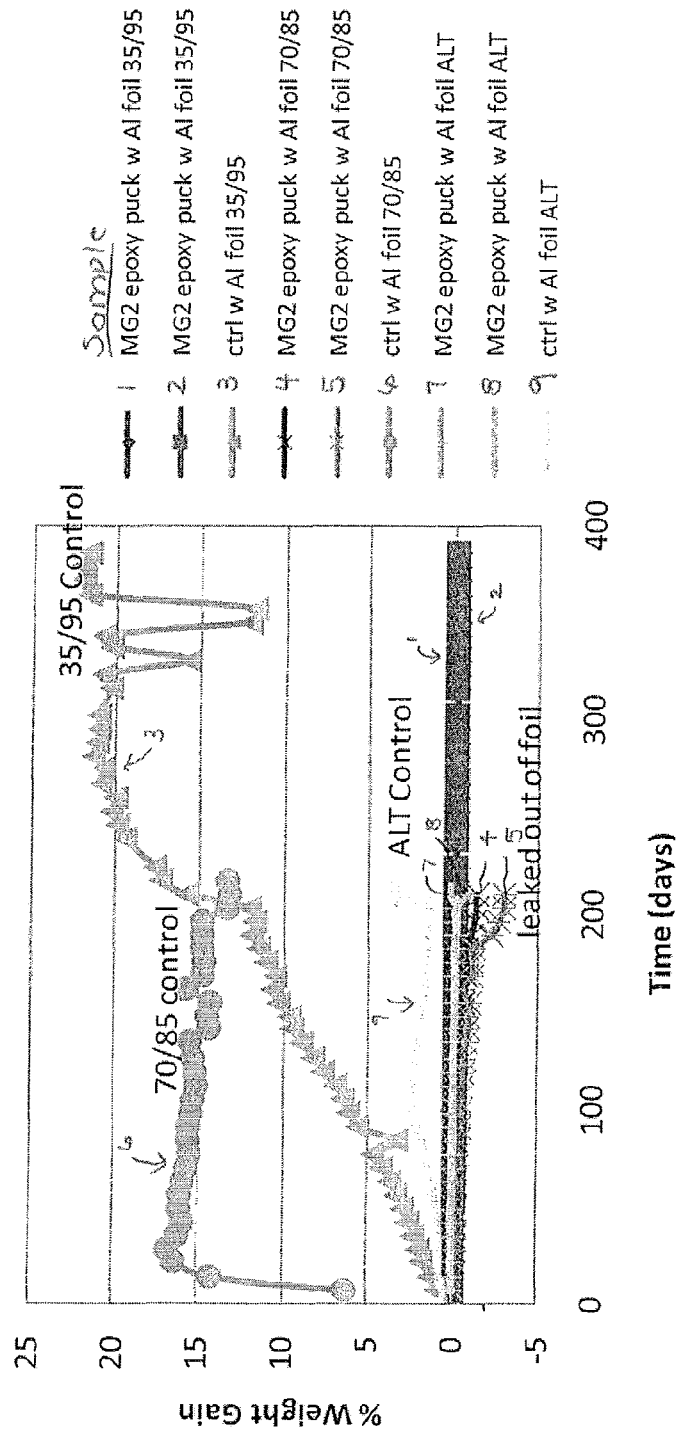
FIG. 5 illustrates a summary of the data comparing samples of the tested encapsulant of the present disclosure with corresponding controls.

With reference to present FIG. 5, the improved moisture barrier properties of the encapsulant of the present disclosure are shown as compared to a control epoxy-based encapsulant. In addition to improved moisture barrier properties, the encapsulant of the present disclosure exhibits low conductivity to avoid shorting out any electrical components that it coats. For example, the dielectric constant, k, of the encapsulant can range from about 1.0 to about 10.0, such as from about 2.0 to about 8.0, such as from about 4.0 to 6.0 when determined at 10 kHz. The low dielectric constant of the encapsulant means that the encapsulant can have a low permittivity, or a low ability to polarize and hold charge. For this reason, materials such as the described encapsulant with low dielectric constants can be good insulators for isolating signal-carrying conductors from each other. Thus, the encapsulant can be used in very dense multi-layered integrated circuits or other electrical devices, wherein coupling between very close metal lines need to be suppressed to prevent degradation in device performance. Moreover, the encapsulant does not detrimentally attenuate radio frequency signals used in AMR technology which is due, at least in part, to the dielectric constant that the encapsulant exhibits.

The encapsulant, which has a melting temperature ranging from about 70° C. to about 80° C., can withstand temperatures of up to about 70° C. without flowing or melting, yet has a low enough viscosity, such as less than about 500 centipoise, at a temperature ranging from about 80° C. to about 95° C. that it can be melted and thereafter dispensed and coated onto any batteries or other components without causing heat damage to such components or shrinkage of the encapsulant. When dispensed at a temperature of from about 80° C. to about 95° C., the encapsulant has a viscosity ranging from about 250 centipoise to about 450 centipoise, such as from about 350 centipoise to about 400 centipoise.

The encapsulant can attach to all relevant surfaces to provide barrier properties to water vapor and liquid water. As will be discussed, the data demonstrates the encapsulant of the present disclosure has the ability to keep moisture and corrosive liquids out of the electrical components that it surrounds to an extent that is improved from existing technology. An exemplary embodiment of an encapsulant material is hereinafter described. The encapsulant material includes a wax and also contains other components to take shrinkage and temperature excursions into account. For example, in addition to a wax, the encapsulant can include a tackifier, a polymer, and a plasticizer. In other embodiments, the encapsulant can further include a thixotropic agent and an antioxidant. These components can all comprise saturated hydrocarbons. Saturated hydrocarbons (alkanes) are the simplest of the hydrocarbon species and are composed entirely of single bonds and are saturated with hydrogen. The general formula for saturated hydrocarbons is $C_nH_{2n+2}$ (assuming non-cyclic structures). Saturated hydrocarbons are found as either linear or branched species and have chemical stability and waterproofing capabilities.

The wax that can be used as the base of the encapsulant material can be a microcrystalline wax that has a melting temperature greater than about 65° C., which is the upper operating temperature of the disclosed encapsulant material. Microcrystalline wax is a refined mixture of solid, saturated aliphatic hydrocarbons and is produced by de-oiling certain fractions from the petroleum refining process. One microcrystalline wax that can be used is IGI MICROSERE™ 5799A, available from The International Group, Inc. It has a melting point of about 77° C., a hardness of 28 dmm at 25° C., and a viscosity of 16 mm²/s at 100° C. Although the 5799A wax was used in the encapsulant testing discussed below, other similar microcrystalline waxes with similar properties can also be used, as will be known to those of ordinary skill in the art. For example, other microcrystalline waxes include IGI 5760A, IGI 5715A, IGI 5871A, IGI 5897A, and IGI 5999A. Other microcrystalline waxes with melting temperatures above the encapsulant operating temperature of about 65° C. are available from Clarus Specialty Products of Rock Hill, S.C.

Microcrystalline waxes differ from refined paraffin waxes in that the molecular structure is more branched and the hydrocarbon chains are longer (higher molecular weight). As a result, the crystal structure of microcrystalline wax is much finer than paraffin wax, and this directly impacts many of the physical properties. High melting point paraffin waxes can also be used, although increased shrinkage of the encapsulant material can result at higher concentrations.

Microcrystalline waxes are tougher, more flexible and generally higher in melting point than paraffin wax. The fine crystal structure also enables microcrystalline wax to bind solvents or oil, thus preventing the sweating-out of compositions. The wax enhances water resistance and contributes to the sharp solid to liquid transition of the encapsulant. However, using high concentrations of microcrystalline wax can also cause shrinkage, so its concentration range was determined by taking this into account.

Another type of wax that can be used is a Fischer-Tropsch wax. Fischer-Tropsch waxes are synthetic waxes produced by Fischer-Tropsch process. Fischer-Tropsch is a method for the synthesis of hydrocarbons and other aliphatic compounds from synthesis gas, a mixture of hydrogen and carbon monoxide in the presence of a catalyst. The hydrogen-carbon monoxide gas mixture is obtained by coal gasification or natural gas reforming. An example of a Fischer-Trope wax is available from Honeywell under the name A-C® 1702.

Regardless of the specific type of wax base component used in the described encapsulant material, it can be present in a range of from about 40% by weight to about 60% by weight of the total encapsulant composition, such as from about 45% by weight to about 55% by weight of the total encapsulant composition.

Depending on the desired properties, the wax composition and concentration can vary. For example, a higher concentration range of wax may increase the operating temperature of the encapsulant to above a temperature of about 65° C.; however, as the concentration of the wax increases, the amount of shrinkage of the encapsulant can also increase, which may affect the moisture barrier properties of the encapsulant.

In addition to a wax, the encapsulant material can also include a tackifier. Tackifiers are chemical compounds used in formulating adhesives to increase the "tack" or stickiness of a surface of the adhesive. Thus, tackifiers can be used in the encapsulant material to increase the ability of the encapsulant material to coat and adhere to any electrical components. One tackifier that can be used is NEVTAC® 80 (low molecular weight, hydrocarbon resin) which is available from Neville Chemical Company. This tackifier is a light-colored, low molecular weight hydrocarbon resin. It has a softening point of about 80° C. and a number average molecular weight of about 990. The resin is compatible with a wide range of waxes. It has a low molecular weight, gives high tack and low solution viscosities, as well as low molten viscosities when used in hot-melt adhesives.

Although the NEVTAC® 80 tackifier was used in testing, other similar hydrocarbon resin tackifiers can be used, as will be known to those of ordinary skill in the art. For example, other tackifiers that can be used include STAYBELITE™ Ester 5-C Resin (a glycerol ester of partially-hydrogenated rosin), FORAL™ AX-E Fully Hydrogenated Resin (a thermoplastic, acidic resin produced by hydrogenating rosin to an exceptionally high degree), FORALYN™ E Partially Hydrogenated Resin (another thermoplastic, acidic resin made by partially hydrogenating rosin), or FORAL™ 85-E Ester of Hydrogenated Rosin (thermoplastic ester resin derived from glycerol and a highly stabilized rosin), all available from Eastman Chemical Company, or QUINTONE™ N180 (an aliphatic hydrocarbon resin, C5/C9 type), available from Zeon Chemicals. The aforementioned tackifiers are either aliphatic (C5) or aromatic (C9) tackifiers. If aromatic tackifiers are used, they can be hydrogenated, which can reduce the moisture vapor transmission rate of the encapsulant material. Using tackifiers with softening points ranging from about 90° C. to about 105° C. can also reduce the moisture vapor transmission rate of the encapsulant material, although this may require higher mixing and dispensing temperatures.

Regardless of the specific type of tackifier used in the described encapsulant material, it can be present in a range of from about 20% by weight to 40% by weight of the total encapsulant composition, such as from about 25% by weight to about 35% by weight of the total encapsulant composition and has a softening point of around 80° C. The concentration range chosen ensures that the encapsulant does not demonstrate brittleness at lower temperatures.

Additionally, the encapsulant can contain a polymer such as a polyolefin, an ethylene-propylene copolymer, or an isobutylene. A polyolefin is a polymer produced from a simple olefin (also called an alkene with the general formula $C_nH_{2n}$) as a monomer. Being saturated hydrocarbons, in general, polyolefins are chemically inert, electrically non-polar, and highly insulating. An equivalent term for a polyolefin is a polyalkene. Polyolefins can be thermoplastic such as polyalphaolefin, polyethylene (PE), polypropylene (PP), polymethylpentene (PMP), and polybutene-1 (PB-1). Elastomeric polyolefins include polyisobutylene (FIB), ethylene propylene rubber (EPR), and ethylene propylene diene monomer (M-class) rubber (EPDM rubber).

One polyolefin that can be used is VESTOPLAST® 704, which is an amorphous poly-alpha-olefin available from Evonik Degussa GmbH. This polyolefin is thermoplastic and is an amorphous polyalphaolefin. It has a softening point of about 105° C., a melt viscosity of about 3000 mPa s to about 4000 mPa s at 190° C., and can be used to add toughness to the encapsulant. Amorphous polyalphaolefins (APAOs) are polymers of α-olefins (for example co- and ter-polymers of ethene, propene and 1-butene). They can be used for a variety of applications in the adhesives and sealants industry and are especially useful for the production of hotmelt adhesives. Although the VESTOPLAST® 704 was used in testing, other similar polyalphaolefins can be used, as will be known to those of ordinary skill in the art. Regardless of the specific type of polyolefin used in the described encapsulant material, it can be present in a range of from about 2.5% by weight to about 20% by weight of the total encapsulant composition, such as from about 5% by weight to about 15% by weight of the total encapsulant composition. The concentration range chosen ensures that the encapsulant does not demonstrate brittleness at low temperatures. Other polymers that can be used include other amorphous poly-alpha-olefins, such as VESTOPLAST® 703 and VESTOPLAST® EP NC 702, also available from Evonik Degussa GmbH. Another polyolefin is AFFINITY® GA 1900, which is a low viscosity polyolefin available from Dow Chemical Company.

The polymer can also be an ethylene-propylene copolymer that can further be combined with silica, such as TRILENE FREEFLOW® CP80 available from Lion Copolymer, LLC. The CP80 is a free-flowing ethylene-propylene polymer made by combining the liquid polymer with silica. The blend can be 68% ethylene-propylene copolymer and 32% silica.

The polymer can also be a polyisobutylene such as a polymer from the OPPANOL™ B series from BASF.

The encapsulant can also contain a plasticizer to soften the material and increase tackiness to all surfaces. One plasticizer that can be used to soften the encapsulant resin is polyisobutylene, which is an elastomeric polyolefin as discussed above. Polyisobutylene, also known as "FIB" or polyisobutene, $(C_4H_8)_n$, is the homopolymer of isobutylene, or 2-methyl-1-propene, on which butyl rubber is based. Structurally, polyisobutylene resembles polypropylene, having two methyl groups substituted on every other carbon atom. Polyisobutylene is a colorless to light yellow viscoelastic material. It is generally odorless and tasteless, though it may exhibit a slight characteristic odor. It has excellent impermeability, and the long polyisobutylene segments of its polymer chains give it good flex properties.

Polyisobutylene is available from Texas Petrochemical Company as TPC 1105. Although TPC 1105 was used in testing, other polyisobutylenes can be used, as will be known to those of ordinary skill in the art, such as polyisobutylenes having a molecular weight of from about 500 to about 2500 grams/mole. Another example of a polyisobutylene that can be used as a plasticizer is INDOPOL™ H35, available from INEOS Oligomers. Regardless of the specific type of plasticizer used in the encapsulant, it can be present in a range of from about 5% by weight to about 25% by weight of the total encapsulant composition, such as from about 8% by weight to about 12% by weight of the total encapsulant composition.

Another component of the encapsulant may be a thixotropic agent. A thixotropic agent can be added to reduce the likelihood that the encapsulant will flow at higher operating temperatures. One thixotropic agent that can be used in the encapsulant of the present disclosure is SIPERNAT® D13, which is available from Evonik Degussa GmbH. SIPERNAT® D13 is a fine particle hydrophobic precipitated silica. Hydrophobic silica is a silica that has hydrophobic groups chemically bonded to the surface. Hydrophobic silica can be made both from fumed and precipitated silica. The hydrophobic groups are normally alkyl or polydimethylsiloxane chains.

Although SIPERNAT® D13 was used as the thixotropic agent during testing of the encapsulant, other agents can be used, as will be known to those of ordinary skill in the art, such as other hydrophobic (fumed or precipitated) silicas or silica powders, which enable the agents to dissolve in the molten wax resin. Other examples of silica powders that can be used include SIPERNAT® D10, SIPERNAT® D11, SIPERNAT® D13, and SIPERNAT® D17, all available from Evonik Degussa GmbH. Another thixotropic agent that can be used is CAB-O-SILO TS-720 Fumed Silica, available from Cabot Corporation. In any event, a thixotropic agent with a low surface area can be used since it can be added in higher concentrations without significantly raising the melt viscosity of the final resin, which could result in higher temperatures that can be damaging to any encapsulated electrical components.

Regardless of the type of thixotropic agent used in the encapsulant, it can be present in a range of from about 0.25% by weight to about 1.50% by weight of the total encapsulant composition, such as from about 0.50% by weight to about 1.00% by weight of the total encapsulant composition. The concentration by weight should be less than 1.50% of the total encapsulant composition in order to maintain a low enough melt viscosity at dispensing temperatures ranging from about 80° C. to about 90° C.

One more component of the encapsulant may be an antioxidant used to prevent oxidation of the resin. Antioxidants are widely used to prevent the oxidative degradation of polymers such as rubbers, plastics and adhesives that causes a loss of strength and flexibility in these materials. Polymers containing double bonds in their main chain can be especially susceptible to oxidation. One antioxidant that can be used in the encapsulant of the present disclosure is NA-Lube AO 220 (BHT), available from King Industries. This phenolic antioxidant has the chemical composition 2,6 di-tert-butyl-p- cresol and is a 100% active phenolic antioxidant. It is a general purpose antioxidant with a low melting point of about 69° C. that liquefies with minimal heat.

Although NA-Lube AO 220 (BHT) was used as the antioxidant during testing of the encapsulant composition, other phenolic antioxidants, aromatic amines, or gallic acid esters can be used, as will be known to those of ordinary skill in the art. Regardless of the type of antioxidant used in the encapsulant, it can be present in a range of about 0.01% to 0.20% by weight.

Generally, the encapsulant material is made by mixing the components above via impeller mixing at a temperature ranging from about 90° C. to about 120° C. The higher temperatures can facilitate and accelerate the dispersion of the polymer. After the encapsulant is mixed, it can be dispensed around any desired electrical components at a temperature ranging from about 80° C. to about 95° C. or lower. Any electrical components can also be preheated to a temperature ranging from about 80° C. to about 95° C., which can prevent shrinkage or pulling away of the encapsulant from the electrical components after cooling due to temperature mismatch. After the encapsulant has been dispensed around an electronic component to form a coating, the coated electronic component, which is now encapsulated, can be allowed to harden and cool before use.

An example encapsulant formed from the components described above has been tested alongside an epoxy-based control to determine moisture barrier properties as compared to the control. Table 1 summarizes the components of the encapsulant used in testing:

TABLE 1

Tested Encapsulant Components

| Component | Name/Supplier | Role in Formulation | Weight % |
|---|---|---|---|
| Microcrystalline Wax | IGI-5799 MICROSERE ™, The International Group, Inc. | Base material | 49.90 |
| Tackifier | NEVTAC ® 80, Neville Chemical Company | Improves adhesion | 29.25 |
| Polymer | VESTOPLAST ® 704, Evonik Degussa GmbH | Adds toughness | 10.00 |
| Plasticizer | TPC 1105, Texas Petrochemical Company | Softens resin | 10.00 |
| Thixotropic Agent | SIPERNAT ® D13, Evonik Degussa GmbH | Arrests flow at higher temperatures | 0.75 |
| Antioxidant | NA-Lube AO 220 (BHT), King Industries | Prevents oxidation | 0.10 |

In the test, the epoxy-based control was coated with the encapsulant as described in Table 1 to form the test sample, which was compared to the epoxy-based control with no coating. The percent weight gain, which can be attributed to the diffusion of moisture through the encapsulant of the present disclosure and the control, was measured over a length of time at varying temperatures and relative humidities. The results of the testing are shown in FIG. 5. As evidenced by FIG. 5, the test samples coated with the encapsulant of the present disclosure exhibited significantly lower percent weight gain than the controls, signaling their improved moisture barrier properties, which can be associated with a lower permeability and a lower moisture vapor transmission rate. Generally, the percent weight gain due to moisture of the encapsulant material ranges from about 0.001% by weight to about 1.5% by weight. The percent weight gain at 200 days at 35° C. and 95% relative humidity can range from about 0.001% by weight to about 0.75% by weight. The percent weight gain at 200 days at 70° C. and 85% relative humidity can range from about 0.05% by weight to about 1.5% by weight. Meanwhile, the percent weight gain at 200 days at under cyclic testing ranging from −40° C. to 70° C. and relative humidities ranging from 0% to 85% can range from about 0.001% by weight to about 0.75% by weight.

More specifically, the encapsulant of the present disclosure and the epoxy control were tested for their moisture barrier properties under three testing conditions. Under testing condition 1, the materials were monitored over a period of about 200 days at 35° C. and 95% relative humidity. By 400 days, the epoxy control, shown as label 3 on FIG. 5, exhibited a percent weight gain of about 20%. Meanwhile, the two samples coated with the encapsulant as described in Table 1 and shown as labels 1 and 2 on FIG. 5, exhibited a percent weight gain on average of less than about 0.15%. This demonstrates that the encapsulant of the present disclosure can provide for improved moisture barrier properties over current potting materials, such as a reduced moisture vapor transmission rate over current potting materials, such as the epoxy control, as shown by the small % weight gain due to moisture of the described encapsulant material.

Next, under testing condition 2, the materials were monitored over a period of about 200 days at 70° C. and 85% relative humidity. By 200 days, the epoxy control, shown as label 6 on FIG. 5, exhibited a percent weight gain of about 15%. On the other hand, the two samples coated with the encapsulant of the present disclosure as described in Table 1, shown as labels 4 and 5 on FIG. 5, exhibited a percent weight gain on average of less than about 0.5%. Again, this demonstrates that the encapsulant of the present disclosure can provide for improved moisture barrier properties, such as a reduced water vapor transmission rate over current potting materials, such as the epoxy control, as shown by the small % weight gain due to moisture of the described encapsulant material.

Under testing condition 3, the encapsulant of the present disclosure and the control were monitored over a period of about 200 days under 12-hour cyclic testing where the samples were held at 25° C. and 35% relative humidity for 2.5 hours. After this time, the conditions were ramped up to 70° C. and 85% relative humidity over a period of 0.5 hours, after which time the samples were held at 70° C. and 85% humidity for 2.5 hours. Next, the samples were subjected to a decrease to 25° C. and 35% relative humidity over a period of 0.5 hours, after which time the samples were held at 25° C. and 35% relative humidity for 2.5 hours. Next, the samples were subjected to a decrease to −40° C. and 0% relative humidity over a period of 0.5 hours, after which time the samples were held at −40° C. and 0% relative humidity for 2.5 hours. Finally, the samples were returned to the starting conditions of 25° C. and 35% relative humidity over a period of 0.5 hours. This cycle was repeated over the course of about 200 days, as shown in FIG. 5. By 200 days, the epoxy control, shown as label 9 on FIG. 5, exhibited a percent weight gain of about 2.3%. In contrast, the samples coated with the encapsulant of the present disclosure, shown as labels 7 and 8 on FIG. 5, exhibited a percent weight gain on average of about 0.18%. Thus, under constant humidity and temperature, as well as under cyclic humidity and temperature, the test samples coated with the encapsulant of the present disclosure exhibited almost no percent weight gain, indicating a lower water vapor transmission rate than the control and almost 100% waterproof characteristics. Table 2 summarizes the data discussed above:

TABLE 2

Percent Weight Gain of Tested Encapsulant and Control, 200 Days

| Label Number | Sample | Test Conditions | % Weight Gain |
|---|---|---|---|
| 1 | Encapsulant | 35° C., 95% Humidity | 0.15 |
| 2 | Encapsulant | 35° C., 95% Humidity | 0.15 |
| 3 | Control | 35° C., 95% Humidity | 20 |
| 4 | Encapsulant | 70° C., 85% Humidity | 0.5 |
| 5 | Encapsulant | 70° C., 85% Humidity | 0.5 |
| 6 | Control | 70° C., 85% Humidity | 15 |
| 7 | Encapsulant | Cyclic | 0.18 |
| 8 | Encapsulant | Cyclic | 0.18 |
| 9 | Control | Cyclic | 2.3 |

While the presently disclosed subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the presently disclosed subject matter and appended claims as would be readily apparent to one of ordinary skill in the art.

What is claimed is:

1. An encapsulant for use with electronic components used in automatic meter reading technology operating at temperatures of less than about 65° C., comprising:
 a wax, wherein the wax is present in an amount ranging from about 40% by weight to about 60% by weight of the encapsulant;
 a tackifier;
 a polymer;
 a plasticizer; and
 an antioxidant;
 wherein the encapsulant has a melting temperature ranging from about 70° C. to about 80° C., wherein the encapsulant exhibits a percent weight gain of from about 0.001% by weight to about 1.5% by weight over a period of about 200 days, when the temperature ranges from about −40° C. to about 70° C., and when the relative humidity ranges from about 0% to about 85%.

2. An encapsulant as in claim 1, wherein the wax comprises a microcrystalline wax, a paraffin wax, or a Fischer-Tropsch wax.

3. An encapsulant as in claim 1, wherein the tackifier is present in an amount ranging from about 20% by weight to about 40% by weight of the encapsulant.

4. An encapsulant as in claim 1, wherein the tackifier comprises a hydrocarbon resin; a glycerol ester of partially hydrogenated rosin; a thermoplastic, acidic resin; or a thermoplastic ester resin.

5. An encapsulant as in claim 1, wherein the polymer is present in an amount ranging from about 2.5% by weight to about 20% by weight of the encapsulant.

6. An encapsulant as in claim 1, wherein the polymer comprises a polyolefin, an ethylene-propylene copolymer, or an isobutylene.

7. An encapsulant as in claim 1, wherein the plasticizer is present in an amount ranging from about 5% by weight to about 25% by weight of the encapsulant.

8. An encapsulant as in claim 1, wherein the plasticizer comprises a polyisobutylene having a molecular weight ranging from about 500 g/mole to about 2500 g/mole.

9. An encapsulant as in claim 1, wherein the antioxidant is present in an amount ranging from about 0.01% by weight to about 0.20% by weight of the encapsulant.

10. An encapsulant as in claim 1, wherein the antioxidant comprises a phenolic antioxidant.

11. An encapsulant as in claim 1, wherein the encapsulant has a dispensing temperature ranging from about 80° C. to about 95° C.

12. An encapsulant as in claim 1, wherein the encapsulant has a viscosity ranging from about 250 centipoise to about 450 centipoise when dispensed.

13. An encapsulant as in claim 1, wherein the encapsulant has a dielectric constant ranging from about 2.0 to about 8.0.

14. An encapsulant as in claim 1, wherein the encapsulant further comprises a thixotropic agent.

15. An encapsulant as in claim 14, wherein the thixotropic agent is present in an amount ranging from about 0.25% by weight to about 1.5% by weight.

16. An encapsulant as in claim 14, wherein the thixotropic agent comprises a hydrophobic silica.

* * * * *